(12) United States Patent
Bhat et al.

(10) Patent No.: US 11,398,827 B1
(45) Date of Patent: Jul. 26, 2022

(54) PHASE-LOCKED LOOP WITH PHASE NOISE CANCELLATION

(71) Applicant: Cisco Technology, Inc., San Jose, CA (US)

(72) Inventors: Abhishek Bhat, Breinigsville, PA (US); Romesh Kumar Nandwana, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/444,636

(22) Filed: Aug. 6, 2021

(51) Int. Cl.
*H03L 7/107* (2006.01)
*H03L 7/099* (2006.01)
*H03L 7/091* (2006.01)

(52) U.S. Cl.
CPC ............ *H03L 7/1075* (2013.01); *H03L 7/091* (2013.01); *H03L 7/099* (2013.01)

(58) Field of Classification Search
CPC ......... H03L 7/085; H03L 7/091; H03L 7/093; H03L 7/10; H03L 7/107; H03L 7/1075
See application file for complete search history.

(56) References Cited

U.S. PATENT DOCUMENTS

| | | | |
|---|---|---|---|
| 9,306,730 B1 | 4/2016 | Shu et al. | |
| 10,651,858 B2 * | 5/2020 | Ott | ........................... H03L 7/089 |
| 2002/0191728 A1 | 12/2002 | Hafez et al. | |
| 2010/0039182 A1 | 2/2010 | Galton et al. | |
| 2014/0225653 A1 | 8/2014 | Hara et al. | |
| 2019/0253059 A1 | 8/2019 | Hossain et al. | |

OTHER PUBLICATIONS

B. J. Thijssen, E. A. M. Klumperink, P. Quinlan and B. Nauta, "Feedforward Phase Noise Cancellation Exploiting a Sub-Sampling Phase Detector," IEEE Transactions on Circuits and Systems II: Express Briefs, vol. 65, No. 11, pp. 1574-1578, Nov. 2018. [aBSTRACT Only].
M. Mikhemar, D. Murphy, A. Mirzaei and H. Darabi, "A Cancellation Technique for Reciprocal-Mixing Caused by Phase Noise and Spurs," IEEE Journal of Solid-State Circuits, vol. 48, No. 12, pp. 3080-3089, Dec. 2013. [Abstract Only].
S. Min, T. Copani, S. Kiaei, and B. Bakkaloglu, "A 90-nm CMOS 5-GHz Ring-Oscillator PLL With Delay-Discriminator-Based Active Phase-Noise Cancellation," IEEE Journal of Solid-State Circuits, vol. 48, No. 5, pp. 1151-1160, May 2013. [Abstract Only].
S. S. Nagam and P R. Kinget, "A -236 3dB FoM sub-sampling low-jitter supply-robust ring-oscillator PLL for clocking applications with feed-forward noise-cancellation," in IEEE Custom Integrated Circuits Conference (CICC), Apr. 2017.

* cited by examiner

*Primary Examiner* — Diana J. Cheng
(74) *Attorney, Agent, or Firm* — Patterson + Sheridan, LLP (57) ABSTRACT

A clock generator includes a first phase-locked loop (PLL), a converter circuit, and a second PLL. The first PLL generates an oscillating signal based on a reference signal and outputs a noise signal indicating a noise component of the oscillating signal. The converter circuit produces an electrical signal based on the noise signal. The second PLL receives the electrical signal from the converter circuit at a loop filter of the second PLL and generates a clock signal based on the oscillating signal and the electrical signal.

18 Claims, 6 Drawing Sheets

PHASE-LOCKED LOOP WITH PHASE NOISE CANCELLATION

TECHNICAL FIELD

Embodiments presented in this disclosure generally relate to clock generators. More specifically, embodiments disclosed herein relate to a cascaded phase-locked loop with phase noise cancellation.

BACKGROUND

Higher data rate requirements in both wireline and wireless communication systems pose design challenges for clock generation circuits. Generally, it is desirable for the clock generation circuits to exhibit low jitter. It may be difficult, however, to reduce jitter without substantially increasing the reference frequency of the clock generation circuit.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

According to an embodiment, a clock generator includes a first phase-locked loop (PLL), a converter circuit, and a second PLL. The first PLL generates an oscillating signal based on a reference signal and outputs a noise signal indicating a noise component of the oscillating signal. The converter circuit produces an electrical signal based on the noise signal. The second PLL receives the electrical signal from the converter circuit at a loop filter of the second PLL and generates a clock signal based on the oscillating signal and the electrical signal. Other embodiments include a method performed by the clock generator.

According to another embodiment, a clock generator includes a first PLL, a converter circuit, and a second PLL. The first PLL produces an oscillating signal. The converter circuit produces an electrical signal based on a noise component of the oscillating signal. The second PLL subsamples an output of a ring oscillator of the second PLL based on the oscillating signal from the first PLL to produce a sampled voltage signal and converts the sampled voltage signal to a current signal. The second PLL also adds the electrical signal from the converter circuit to the current signal at a loop filter of the second PLL to produce a combined signal, filters the combined signal using the loop filter to produce a filtered signal, and generates a clock signal using the ring oscillator and the filtered signal. Other embodiments include a method performed by the clock generator.

EXAMPLE EMBODIMENTS

This disclosure describes a clock generator that includes cascaded PLLs that use phase noise cancellation to increase bandwidth and reduce jitter, in certain embodiments. The clock generator includes two PLLs that are cascaded so that the second PLL generates a clock signal based on the output of the first PLL. The clock generator also includes a converter circuit between the two PLLs that produces an electrical signal based on a noise signal representing a noise component of the output of the first PLL. The second PLL uses the electrical signal to cancel the noise component when generating the clock signal using the output of the first PLL. As a result, the clock generator exhibits a high bandwidth and reduces jitter without increasing the reference frequency, in particular embodiments. Additionally, the converter circuit in the clock generator does not need calibration, which reduces the time needed to setup and startup the clock generator.

Figure 1:
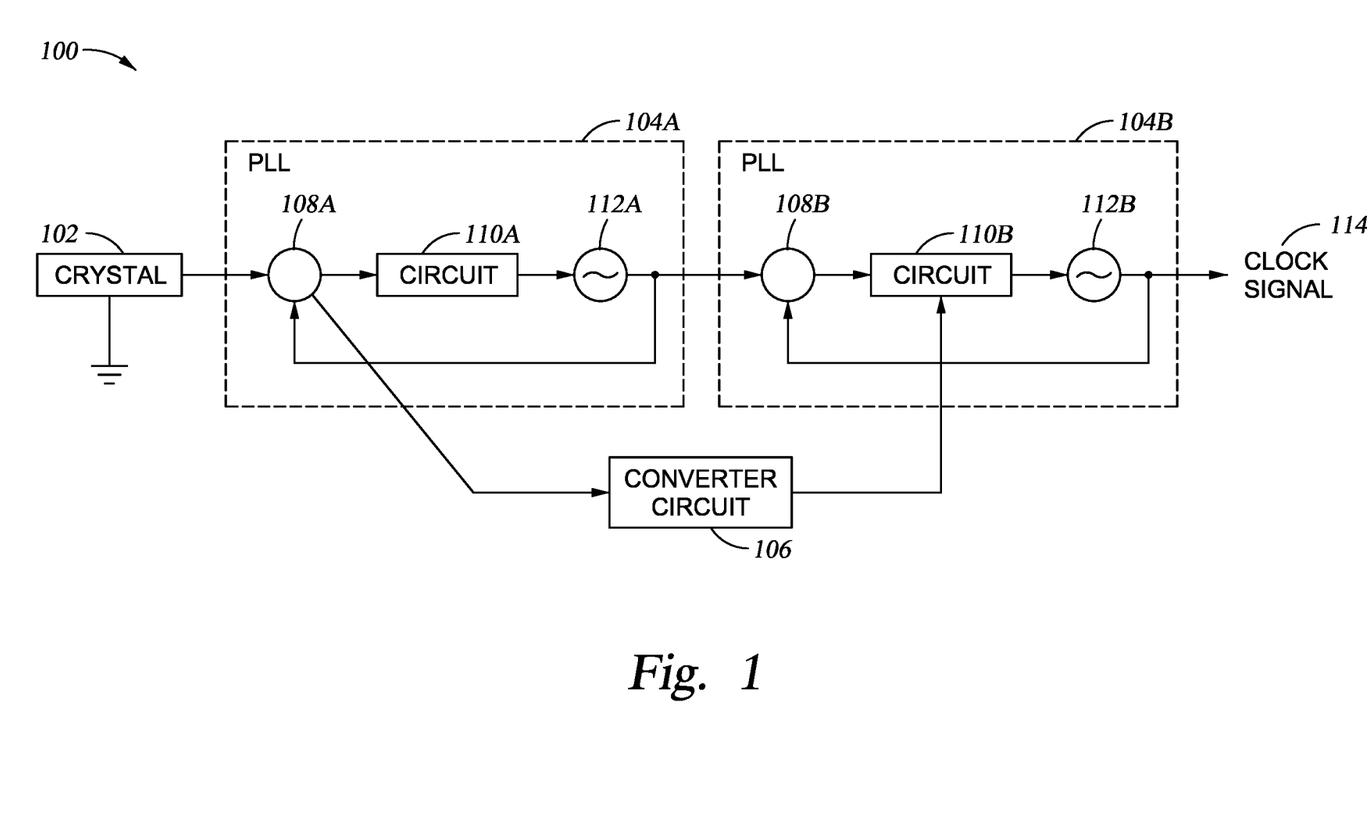
FIG. 1 illustrates an example clock generator.

FIG. 1 illustrates an example clock generator 100. As seen in FIG. 1, the clock generator 100 includes a crystal 102, PLLs 104A and 104B, and a converter circuit 106. The clock generator 100 produces a clock signal 114 using a reference signal from the crystal 102. The PLL 104A generates an oscillating signal based on a reference signal from the crystal 102. The PLL 104B generates the clock signal 114 based on the oscillating signal. The converter circuit 106 produces an electrical signal based on a noise signal from the PLL 104A, and the PLL 104B uses the electrical signal to cancel or remove a noise component of the oscillating signal from the PLL 104A. As a result, the clock generator 100 exhibits a high bandwidth and reduces the jitter of the clock signal 114, in particular embodiments.

The crystal 102 may be part of a crystal oscillator that uses the mechanical resonance of a vibrating crystal to create an electrical reference signal with a substantially constant frequency. The crystal oscillator may use any suitable crystal 102 (e.g., a quartz crystal or a ceramic). The electrical reference signal is input into the cascaded PLLs 104A and 104B to produce the clock signal 114.

The PLL 104A uses the electrical reference signal from the crystal 102 to generate an oscillating signal for the PLL 104B. The oscillating signal may have a frequency that is higher than the frequency of the reference signal from the crystal 102. As seen in FIG. 1, the PLL 104A includes a phase detector 108A, a circuit 110A, and a voltage controlled oscillator (VCO) 112A. The phase detector 108A may be a sub-sampling phase detector that samples the oscillating signal from the VCO 112A based on the electrical reference signal from the crystal 102. For example, the electrical reference signal may be used to control certain switches in the phase detector 108A to sample near zero-crossings of the oscillating signal from the VCO 112A. The phase detector 108A outputs a voltage signal that represents the instantaneous phase difference between the reference signal from the crystal 102 and the oscillating signal from the VCO 112A. The output from the phase detector 108A is then sent to the circuit 110A.

The circuit 110A converts the voltage signal from the phase detector 108A to a current signal. The circuit 110A may also filter the current signal. In some embodiments, the circuit 110A includes a transconductor that converts the voltage signal from the phase detector 108A to a current signal. The circuit 110A may also include a loop filter that filters the current signal from the transconductor. The circuit 110A outputs the filtered signal to the VCO 112A.

The VCO 112A generates an oscillating signal based on the signal from the circuit 110A. In some embodiments, the frequency of the oscillating signal is controlled by the voltage of the signal from the circuit 110A. For example, the higher the voltage of the signal from the circuit 110A, the higher the frequency of the oscillating signal generated by the VCO 112A. The PLL 104A outputs the oscillating signal to the PLL 104B.

The converter circuit 106 produces an electrical signal based on a noise signal from the phase detector 108A. For example, the converter circuit 106 may convert a voltage component of the noise signal to a current signal. The noise signal may represent a noise component of the oscillating signal generated by the VCO 112A. The converter circuit 106 outputs the current signal to the PLL 104B. The PLL 104B uses the current signal from the converter circuit 106 to cancel or remove the noise component in the oscillating signal generated by the VCO 112A. As a result, the bandwidth of the PLL 104B is increased and the jitter of the clock signal 114 is reduced, in particular embodiments.

The PLL 104B uses the oscillating signal from the PLL 104A and the current signal from the converter circuit 106 to generate the clock signal 114. As seen in FIG. 1, the PLL 104B includes a phase detector 108B, a circuit 110B, and a VCO 112B. The phase detector 108B may be a sub-sampling phase detector that samples the clock signal 114 based on the oscillating signal from the PLL 104A. For example, the oscillating signal from the PLL 104A may be used to control the switches in the phase detector 108B to sample the clock signal 114 from the VCO 112B near the zero-crossings of clock signal 114. The phase detector 108B outputs a voltage signal that represents the instantaneous phase difference between the oscillating signal from the VCO 112A and the clock signal 114. The phase detector 108B sends the voltage signal to the circuit 110B.

The circuit 110B converts the voltage signal from the phase detector 108B to a current signal. The circuit 110B then adds to that current signal the current signal from the converter circuit 106 that represents the noise component of the oscillating signal from the PLL 104A. By adding the current signal from the converter 106, the circuit 110B cancels or removes the noise component of the oscillating signal from the PLL 104A. The circuit 110B then filters the signal resulting from adding the two current signals and outputs the filtered signal to the VCO 112B. In certain embodiments, the circuit 110B includes a transconductor that converts the voltage signal from the phase detector 108B to a current signal. The circuit 110B also includes a loop filter that receives the current signal from the transconductor. The loop filter also receives the current signal from the converter circuit 106. As a result, the current signal from the transconductor and the current signal from the converter circuit 106 are summed at the loop filter. The loop filter then filters the summed signal and outputs the filtered signal to the VCO 112B.

The VCO 112B generates the clock signal 114 based on the filtered signal from the circuit 110B. In certain embodiments, the voltage of the filtered signal from the circuit 110B controls the frequency of the clock signal 114 generated by the VCO 112B. For example, the higher the voltage of the filtered signal from the circuit 110B, the higher the frequency of the clock signal 114 generated by the VCO 112B. In certain embodiments, because the noise component of the high frequency oscillating signal from the PLL 104A is cancelled or removed in the circuit 110B, the PLL 104B has a high bandwidth and generates a low jitter, high frequency clock signal 114. By cancelling or removing the noise component of the oscillating signal from the PLL 104A, the PLL 104B can use the oscillating signal from the PLL 104A as a high frequency reference signal to generate the clock signal 114 (as opposed to a lower frequency reference signal from the crystal oscillator). As a result, the bandwidth of the PLL 104B is increased and the phase noise of the VCO 112B is filtered, which reduces the jitter of the clock signal 114.

Figure 2:
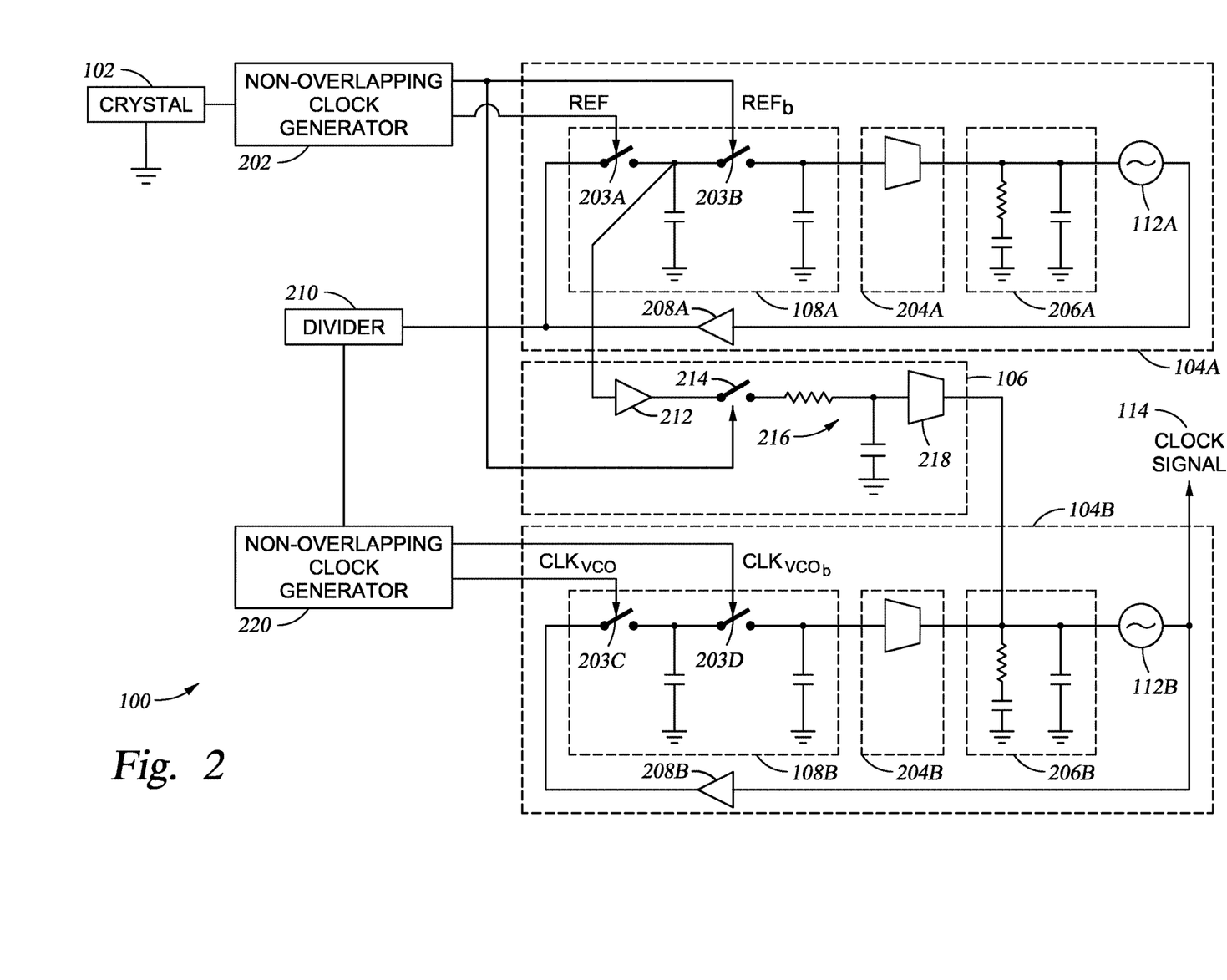
FIG. 2 illustrates the clock generator of FIG. 1.

FIG. 2 illustrates the clock generator 100 of FIG. 1. The clock generator 100 includes cascaded PLL's 104A and 104B that use a reference signal from a crystal oscillator to generate a clock signal 114. The clock generator 100 includes a converter circuit 106 that generates an electrical signal that the PLL 104B uses to cancel or remove a noise component of an oscillating signal generated by the PLL 104A. By cancelling or removing the noise component, the bandwidth of the PLL 104B is increased due to the high frequency output of PLL 104A and the jitter of the clock signal 114 is reduced, in particular embodiments.

The clock generator 100 includes a non-overlapping clock generator 202 that receives the reference signal from the crystal 102. As discussed previously, the crystal 102 may be part of a crystal oscillator that produces an oscillating electrical signal based on the vibrations of the crystal 102 (e.g., quartz). The non-overlapping clock generator 202 uses the oscillating electrical signal from the crystal oscillator to generate non-overlapping reference signals. The non-overlapping reference signals may have the same frequency and there may be a time between the pulses of these reference signals when neither of the reference signals is high. The non-overlapping clock generator 202 may include one or more inverters that introduce delay into the oscillating electrical signal from the crystal oscillator, which produces the non-overlapping reference signals. In the example of FIG. 2, the non-overlapping clock generator 202 produces two reference signals (REF and $REF_b$). The non-overlapping clock generator 202 outputs the reference signals to the PLL 104A.

The PLL 104A includes a phase detector 108A, a transconductor 204A, a loop filter 206A, a VCO 112A, and a buffer 208A. Generally, the PLL 104A produces an oscillating signal based on the reference signals from the non-overlapping clock generator 202.

The phase detector 108A may be a subsampling phase detector. As seen in FIG. 2, the phase detector 108A includes switches 203A and 203B that are controlled by the reference signals from the non-overlapping clock generator 202 (REF and $REF_b$). As a result, the reference signals control when the switches 203A and 203B open or close. In the example of FIG. 2, the switch 203A is controlled by REF and the switch 203B is controlled by $REF_b$. When switch 203A is closed, it tracks the oscillating signal produced by VCO 112A and when switch 203B is closed it samples and holds the oscillating signal produced by VCO 112A near its zero-crossings The non-overlapping signals REF and $REF_b$ may ensure that switches 203A and 203B are not closed at the same time. The phase detector 108A outputs the sampled signal to the transconductor 204A.

The transconductor 204A converts the sampled signal from the phase detector 108A from a voltage signal to a current signal. The transconductor then outputs the current signal to the loop filter 206A, which may be a Type I or Type II loop filter. The loop filter 206A filters the signal from the transconductor 204A to produce a filtered signal. The loop filter outputs the filtered signal to the VCO 112A. The VCO 112A produces an oscillating signal based on a voltage of the filtered signal from the loop filter 206A. For example, the higher the voltage of the filtered signal from the loop filter 206A, the higher the frequency of the signal produced by the VCO 112A. The frequency of the oscillating signal produced by the VCO 112A may be higher than the frequency of the crystal oscillator. The VCO 112A outputs the oscillating signal to the buffer 208A. The buffer 208A may buffer or delay the oscillating signal from the VCO 112A. In certain embodiments the buffer avoids the loading of the VCO 112A by the phase detector 108A. The phase detector 108A samples the oscillating signal output by the buffer 208A.

The clock generator 100 includes a divider 210 that reduces the frequency of the oscillating signal from the buffer 208A. The divider 210 may be setup to divide the frequency of the oscillating signal by any suitable multiple. The output signal of the divider 210 may still have a frequency that is higher than the frequency of the reference signal from the crystal oscillator.

The clock generator 100 includes a non-overlapping clock generator 220 that receives the output signal of the divider 210. The non-overlapping clock generator 220 generates non-overlapping clock signals based on the output signal of the divider 210. The non-overlapping clock signals may have the same frequency and there may be a time between pulses of the non-overlapping clock signals when neither of the non-overlapping clock signals is high. In the example of FIG. 2, the non-overlapping clock generator 220 generates two clock signals labeled $CLK_{VCO}$ and $CLK_{VCOb}$. The frequencies of $CLK_{vco}$ and $CLK_{vcob}$ may be higher than the frequencies of REF and $REF_b$. The non-overlapping clock generator 220 outputs the clock signals to the PLL 104B.

The convertor circuit 106 receives a noise signal from a point between the switches 203A and 203B in the phase detector 108A. The noise signal represents a noise component of the oscillating signal generated by the VCO 112A. The converter circuit 106 includes a buffer 212, a switch 214, a filter 216, and a transconductor 218. Generally, when the PLL 104A is locked, the voltage signal received by the buffer 212 has only the noise component of the oscillating signal from the VCO 112A. Hence no extra circuitry or calibration would be needed to generate the noise component of the oscillating signal. The converter circuit 106 converts a voltage component of the noise signal from the phase detector 108A to a current signal.

The buffer 212 receives the noise signal from the phase detector 108A without disturbing the output voltage of the phase detector 108A. The switch 214 receives the noise signal from the buffer 212. The switch 214 is controlled by a reference signal from the non-overlapping clock generator 202 (e.g., $REF_b$). When the switch 214 is closed, the noise signal is communicated from the buffer 212 to the filter 216. The filter 216 filters the high frequency component of the noise signal and communicates the filtered noise signal to the transconductor 218. The transconductor 218 then converts the filtered signal from a voltage signal to a current signal. The filter 216 includes a capacitor that stores a voltage of the noise signal, which the transconductor converts to the current signal. The transconductor 218 outputs the current signal to the PLL 104B. The PLL 104B then uses the current signal from the transconductor 218 to cancel or remove the noise component of the oscillating signal produced by the VCO 112A.

The PLL 104B includes a phase detector 108B, a transconductor 204B, a loop filter 206B, a VCO 112B, and a buffer 208B. Generally, the PLL 104B generates the clock signal 114 based on the oscillating signal produced by the VCO 112A and the current signal from the converter circuit 106. In certain embodiments, the clock signal 114 has the same frequency as the oscillating signal produced by VCO 112A, but the frequency of the crystal oscillator 102 used as input to PLL 104A has a lower frequency than the input to the PLL 104B. As a result, the PLL 104A has a lower bandwidth than the PLL 104B, and the oscillating signal of VCO 112A has higher jitter than the clock signal 114.

The phase detector 108B may be a subsampling phase detector that samples the clock signal 114 produced by the VCO 112B. The phase detector 108B includes switches 203C and 203D that are controlled by the clock signals from the non-overlapping clock generator 220. In the example of FIG. 2, the switch 203C is controlled by the clock signal $CLK_{vco}$, and the switch 203D is controlled by the clock signal $CLK_{vcob}$. When switch 203C is closed, it tracks the clock signal 114 produced by VCO 112B, and when switch 203D is closed, it samples and holds the clock signal 114 near its zero-crossings. In some embodiments, the phase detector 108B matches the phase detector 108A. The phase detector 108B outputs the sampled signal to the transconductor 204B. The transconductor 204B converts the sampled signal from the phase detector 108B from a voltage signal to a current signal. The transconductor 204B then outputs the current signal to the loop filter 206B, which may be a Type I or Type II loop filter. In some embodiments, the transconductor 204B has the same transconductance as the transconductor 218 of the converter circuit 106.

The current signal from the transconductor 204B is combined (e.g., summed) with the current signal from the converter circuit 106 at the loop filter 206B. The current signal from the converter circuit 106 may be an additive inverse of the noise component in the output current of the transconductor 204B, such that the current signal from the converter circuit 106 cancels or removes the noise component when added to the current signal of transconductor 204B. The loop filter 206B then filters this combined signal and outputs the filtered signal to the VCO 112B. The VCO 112B then produces the clock signal 114 based on a voltage of the filtered signal from the loop filter 206B. For example, the higher the voltage of the filtered signal from the loop filter 206B, the higher the frequency of the clock signal 114 produced by the VCO 112B. In some embodiments, the VCO 112B and the VCO 112A are same frequency oscillators (e.g., the VCO 112A and the VCO 112b produce the same output frequencies for the same inputs). In other embodiments, the VCO 112B and the VCO 112A are different frequency oscillators that produce different output frequencies for the same inputs. In certain embodiments, by adding the current signal from the converter circuit 106 to the current signal from the transconductor 204B, the PLL 104B cancels or removes the noise component from the oscillating signal generated by the VCO 112A, which reduces the power consumption of the clock generator 100 for the same phase noise and jitter in the clock signal 114. The buffer 208B receives the clock signal 114 produced by the VCO 112B. In certain embodiments the buffer avoids the loading of VCO 112B by the phase detector 108B. As a result, the phase detector 108B samples the clock signal 114 output by the buffer 208B without disturbing the operation of the VCO 1126.

Figure 3:
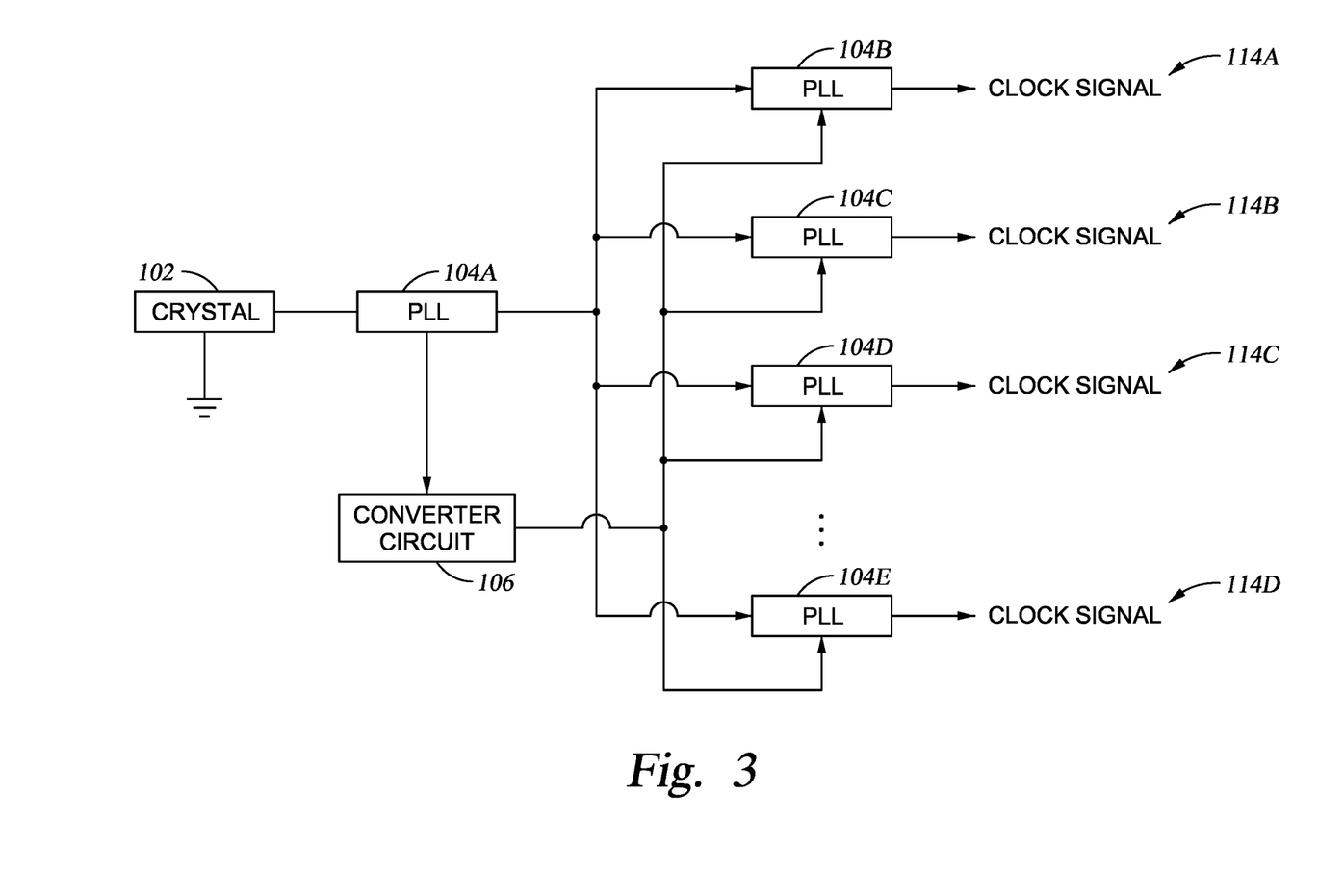
FIG. 3 illustrates an example clock generator that generates multiple clock signals.

FIG. 3 illustrates an example clock generator that generates multiple clock signals using multiple lanes, generally used in a multi-lane transceiver system. As seen in FIG. 3, the clock generator includes the crystal 102, PLL 104A, the converter circuit 106, and multiple PLLs 104B, 104C, 104D, and 104E that use an oscillating signal from the PLL 104A and an electrical signal from the converter circuit 106 to generate multiple clock signals 114A, 114B, 114C, and 114D, with each lane including one of the PLLs 104B, 104C, 104D, and 104E. The clock generator may include any suitable number of PLLs 104 that generate clock signals 114 using the oscillating signal from the PLL 104A and the electrical signal from the converter circuit 106 The clock generator may include additional dividers and non-overlapping clock generators that are setup to generate non-overlapping clock signals for the PLLs 104B, 104C, 104D, and 104E based on the oscillating signal from the PLL 104A. The PLLs 104B, 104C, 104D, and 104E (which may be Integer-N subsampling PLLs or Frac-N subsampling PLLs) then sample the clock signals 114A, 114B, 114C, and 114D based on these non-overlapping clock signals and convert the sampled signals to current signals. If the PLLs 104B, 104C, 104D, and 104E are Frac-N subsampling PLLs, the PLLs 104B, 104C, 104D, and 104E may be used to correct the PPM frequency error between each lane in a multi-lane transceiver system. The PLLs 104B, 104C, 104D, and 104E then sum the current signals with the electrical signal from the converter circuit 106 at loop filters to cancel or remove the noise component from the oscillating signal from the PLL 104A. The loop filters then filter the summed signal. VCOs in the PLLs 104B, 104C, 104D, and 104E then generate the clock signals 114A, 114B, 114C, and 114D based on the filtered signals.

Figure 4:
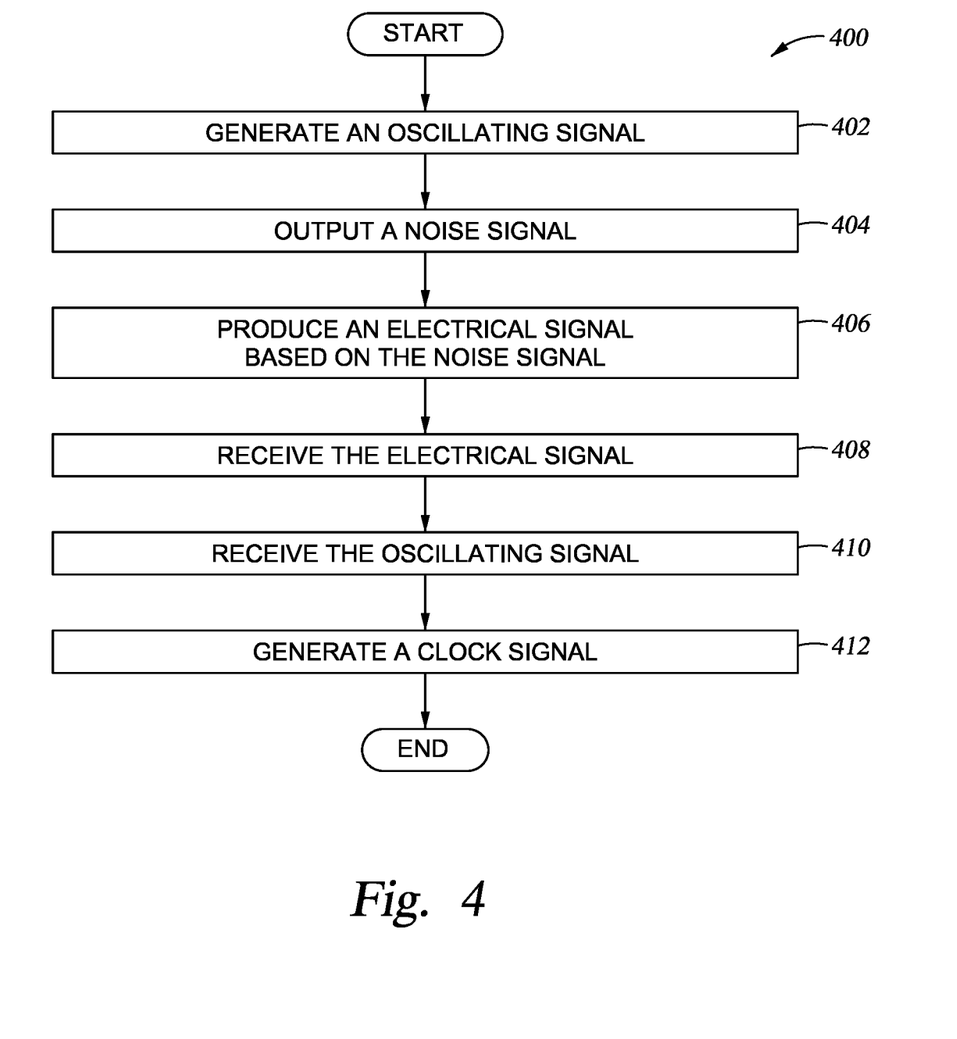
FIG. 4 is a flowchart of an example method performed in the clock generator of FIG. 1.

FIG. 4 is a flowchart of an example method 400 performed in the clock generator 100 of FIG. 1. In certain embodiments, different components of the clock generator 100 perform the steps of the method 400. By performing the method 400, the clock generator 100 produces a high frequency clock signal 114 with reduced jitter using a low frequency crystal oscillator signal.

In block 402, the PLL 104A of the clock generator 100 generates an oscillating signal. The VCO 112A in the PLL 104A generates the oscillating signal based on the voltage of a filtered signal from the loop filter 206A in the PLL 104A. Additionally, in block 404, the PLL 104A outputs a noise signal. The noise signal may be output from a point between the switches 203A and 203B of the phase detector 108A of the PLL 104A. The noise signal represents a noise component of the oscillating signal generated by the VCO 112A in block 402.

In block 406, the converter circuit 106 of the clock generator 100 produces an electrical signal based on the noise signal. In certain embodiments, the converter circuit 106 includes a transconductor 218 that converts a voltage component of the noise signal to a current signal. The converter circuit 106 then outputs the current signal to another PLL 104B.

The PLL 104B receives the electrical signal from the converter circuit 106 in block 408. In some embodiments, the PLL 104B receives the electrical signal from the converter circuit 106 at the loop filter 206B of the PLL 104B. In block 410, the non-overlapping clock generator 220 receives the oscillating signal generated by the VCO 112A. The non-overlapping clock generator 220 uses the oscillating signal to produce clock signals that are used by the PLL 104B to produce the clock signal 114.

In block 412, the PLL 104B generates the clock signal 114 based on the oscillating signal generated by the VCO 112A and the electrical signal output by the converter circuit 106. The PLL 104B includes a phase detector 108B that samples the clock signal 114 generated by the VCO 112B based on the clock signals produced by the non-overlapping clock generator 220. The PLL 104B also includes the transconductor 204B that converts the sampled signal from the phase detector 108B from a voltage signal to a current signal. The PLL 104B adds the current signal from the transconductor 204B and the electrical signal from the converter circuit 106 at the loop filter 206B of the PLL 104B. The loop filter 206B then filters the low-noise, combined signal. The VCO 112B generates the clock signal 114 using the voltage of the filtered signal from the loop filter 206B. The PLL 104B then outputs the clock signal 114. In certain embodiments, the PLL 104B has higher bandwidth and lower noise component than PLL 104A. As a result the PLL 104B generates the clock signal 114 with low jitter when compared to the oscillating signal output PLL 104A.

Figure 5:
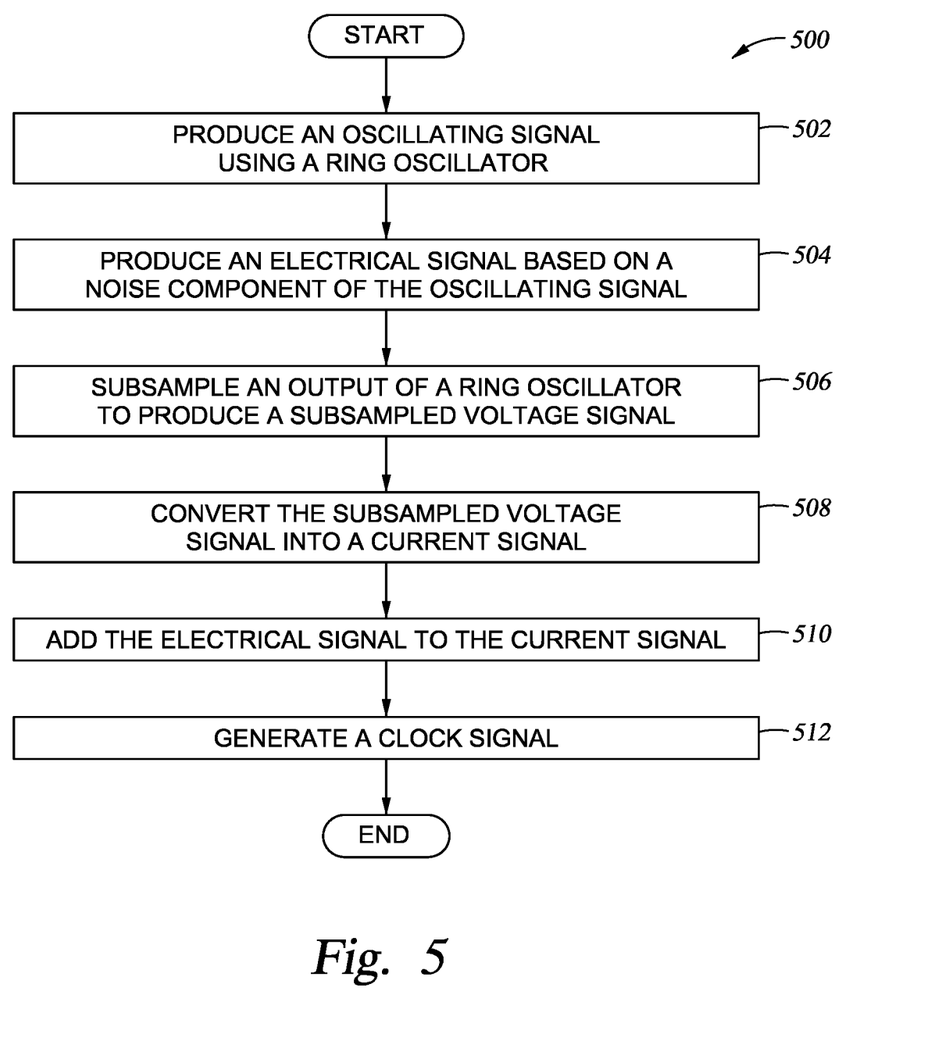
FIG. 5 is a flowchart of an example method performed in the clock generator of FIG. 1.

FIG. 5 is a flowchart of an example method 500 formed in the clock generator 100 of FIG. 1. In particular embodiments, components of the clock generator 100 perform the steps of the method 500. By performing the method 500, the clock generator 100 produces a clock signal 114 with high frequency and low jitter.

In block 502, the PLL 104A of the clock generator 100 produces an oscillating signal. A VCO 112A of the PLL 104A generates the oscillating signal based on a reference signal produced by a crystal oscillator. The oscillating signal may have a higher frequency than the frequency of the reference signal from the crystal oscillator. In certain embodiments the VCO 112A is a ring oscillator.

In block 504, the converter circuit 106 produces an electrical signal based on a noise component of the oscillating signal. The converter circuit receives a noise signal at a point between the switches 203A and 203B of the phase detector 108A in the PLL 104A. The converter circuit 106 includes a transconductor 218 that converts a voltage component of the noise signal to a current signal. The converter circuit 106 then outputs the current signal as the electrical signal.

In block 506, the phase detector 108B of the PLL 104B samples an output of the VCO 112B. For example, the phase detector 108B includes the switches 203C and 203D that are controlled using clock signals generated by the non-overlapping clock generator 220 based on the oscillating signal generated by the VCO 112A. Using the switches 203C and 203D, the phase detector 108B samples the output of the VCO 112B.

In block 508, the transconductor 204B in the PLL 104B converts the sampled signal from the phase detector 108B into a current signal. In block 510, the PLL 104B adds the electrical signal from the converter circuit 106 to the current signal from the transconductor 204B. By adding the electrical signal and the current signal, the PLL 104B cancels or removes the noise component of the oscillating signal produced by the VCO 112A. In certain embodiments, the PLL 104B adds the current signal to the electrical signal at the loop filter 206B of the PLL 104B. The loop filter 206B then filters the low-noise, combined signal to produce a filtered signal.

In block 512, the VCO 112B generates the clock signal 114 based on a voltage of the filtered signal from the loop filter 206B. For example, the higher the voltage of the filtered signal, the higher the frequency of the clock signal 114 produced by the VCO 112B. In certain embodiments, the clock signal 114 has the same frequency as the oscillating signal produced by the VCO 112A, but with a reduced jitter and phase noise.

Figure 6:
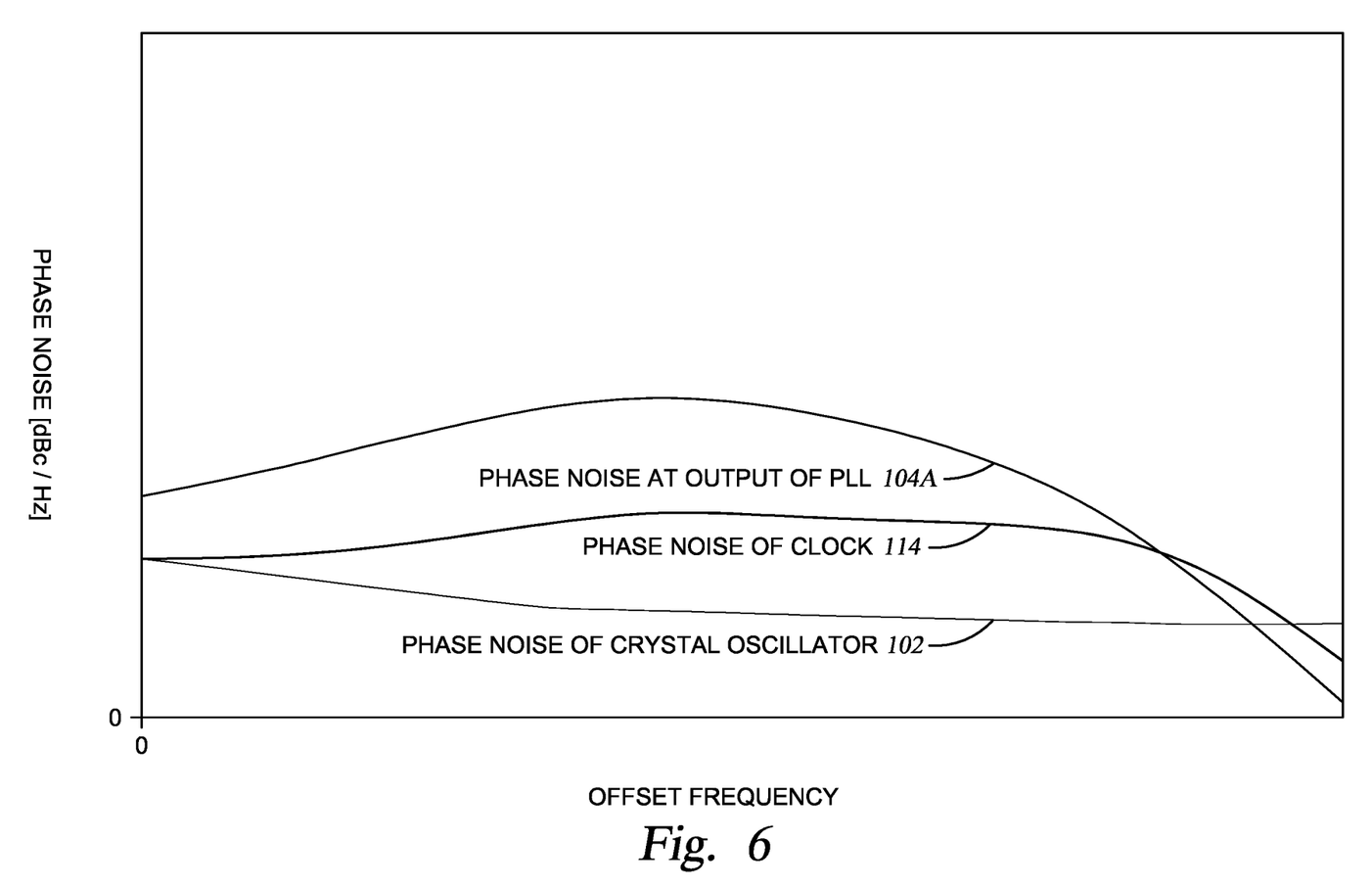
FIG. 6 illustrates an example result of using the converter circuit of FIG. 1.

FIG. 6 illustrates an example result of using the converter circuit 106 of FIG. 1. As seen in FIG. 6, the phase noise of the output of the PLL 104B (e.g., the clock signal 114) is generally lower than the phase noise of the output of the PLL 104A (e.g., oscillating signal output by the PLL 104A).

In summary, the clock generator 100 includes two PLLs 104A and 104B that are cascaded so that the second PLL 104B generates a clock signal 114 based on the output of the first PLL 104A. The clock generator 100 also includes a converter circuit 106 between the two PLLs 104A and 104B that produces an electrical signal based on a noise signal representing a noise component of the output of the first PLL 104A. The second PLL 104B uses the electrical signal to cancel or remove the noise component when generating the clock signal 114. As a result, the clock generator 100 exhibits a high bandwidth and reduced jitter without increasing the reference frequency, in particular embodiments. Additionally, the clock generator 100 does not need extra calibration to generate the noise component of PLL 104A, which reduces the time needed to setup and startup the clock generator 100.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A clock generator comprising:
   a first phase-locked loop (PLL) configured to:
      generate an oscillating signal based on a reference signal; and
      output a noise signal indicating a noise component of the oscillating signal;
   a converter circuit configured to produce a first electrical signal based on the noise signal; and
   a second PLL configured to:
      generate a second electrical signal based on the oscillating signal;
      sum the first electrical signal and the second electrical signal at a loop filter of the second PLL to produce a summed signal; and
      generate a clock signal based on the summed signal.

2. The clock generator of claim 1, wherein the first PLL comprises a phase detector configured to produce the noise signal.

3. The clock generator of claim 2, wherein the phase detector is a sub-sampling phase detector.

4. The clock generator of claim 1, wherein the first electrical signal cancels the noise component of the oscillating signal at the loop filter of the second PLL.

5. The clock generator of claim 1, wherein the first PLL and the second PLL comprise same frequency oscillators.

6. The clock generator of claim 1, wherein the first PLL and the second PLL comprise different frequency oscillators.

7. The clock generator of claim 1, wherein the first PLL has a lower bandwidth than the second PLL.

8. The clock generator of claim 1, wherein the first PLL and the second PLL comprise matching phase detectors.

9. The clock generator of claim 1, further comprising a third PLL configured to generate a second clock signal based on the summed signal.

10. A method comprising:
    generating, by a first PLL, an oscillating signal based on a reference signal;
    outputting, by the first PLL, a noise signal indicating a noise component of the oscillating signal;
    producing, by a converter circuit, a first electrical signal based on the noise signal;
    generating, by a second PLL, a second electrical signal based on the oscillating signal,
    summing, at a loop filter of the second PLL, the first electrical signal from the converter circuit and the second electrical signal to produce a summed signal; and
    generating, by the second PLL, a clock signal based on the summed signal.

11. The method of claim 10, further comprising producing the noise signal using a phase detector of the first PLL.

12. The method of claim 11, wherein the phase detector is a sub-sampling phase detector.

13. The method of claim 10, wherein the first electrical signal cancels the noise component of the oscillating signal at the loop filter of the second PLL.

14. The method of claim 10, wherein the first PLL and the second PLL comprise same frequency oscillators.

15. The method of claim 10, wherein the first PLL has a lower bandwidth than the second PLL.

16. The method of claim 10, wherein the first PLL and the second PLL comprise matching phase detectors.

17. The method of claim 10, further comprising generating, by a third PLL, a second clock signal based on the summed signal.

18. A clock generator comprising:
    a first PLL configured to produce an oscillating signal;
    a converter circuit configured to produce a first electrical signal based on a noise component of the oscillating signal; and
    a second PLL configured to:
       subsample, based on the oscillating signal from the first PLL, a clock signal produced by a ring oscillator of the second PLL to produce a sampled voltage signal;
       convert the sampled voltage signal to a current signal;
       sum the first electrical signal from the converter circuit and the current signal at a loop filter of the second PLL to produce a summed signal;
       filter the summed signal using the loop filter to produce a filtered signal; and
       generate the clock signal using the ring oscillator and the filtered signal.

* * * * *